(12) United States Patent
Bagchi et al.

(10) Patent No.: US 12,212,308 B2
(45) Date of Patent: Jan. 28, 2025

(54) LOW-AREA, WIDE RANGE CLOCKING SCHEME USING INDUCTANCE/CAPACITANCE OSCILLATORS

(71) Applicant: Synopsys, Inc., Mountain View, CA (US)

(72) Inventors: Srirup Bagchi, Mountain View, CA (US); Kumail Khurram, Mountain View, CA (US)

(73) Assignee: SYNOPSYS, INC., Mountain View, CA (US)

( * ) Notice: Subject to any disclaimer, the term of this patent is extended or adjusted under 35 U.S.C. 154(b) by 357 days.

(21) Appl. No.: 17/888,974

(22) Filed: Aug. 16, 2022

(65) Prior Publication Data

US 2023/0063149 A1 Mar. 2, 2023

(30) Foreign Application Priority Data

Aug. 25, 2021 (IN) .............................. 202141038433

(51) Int. Cl.
*H03J 3/30* (2006.01)
*G06F 1/08* (2006.01)
*G06F 1/12* (2006.01)
*H03J 7/04* (2006.01)

(52) U.S. Cl.
CPC .................. *H03J 3/30* (2013.01); *G06F 1/08* (2013.01); *G06F 1/12* (2013.01); *H03J 7/04* (2013.01)

(58) Field of Classification Search
CPC ........................................................ H03J 3/30
See application file for complete search history.

(56) References Cited

U.S. PATENT DOCUMENTS

| | | | | | |
|---|---|---|---|---|---|
| 4,792,965 | A | * | 12/1988 | Morgan | H04B 5/00 340/870.31 |
| 7,772,933 | B1 | * | 8/2010 | Nicholls | H03B 5/1218 331/46 |
| 2010/0308924 | A1 | * | 12/2010 | Rangarajan | H03B 21/00 331/48 |
| 2017/0359027 | A1 | * | 12/2017 | Hekmat | H03L 7/089 |

* cited by examiner

*Primary Examiner* — Hsinchun Liao
(74) *Attorney, Agent, or Firm* — Jaquez Land Greenhaus; Bruce W. Greenhaus

(57) ABSTRACT

An oscillator comprising a first oscillator circuit having a first inductive portion, a plurality of shared switches for selectively connecting a shared oscillator tuning circuit and a second oscillator circuit having a second inductive portion, the plurality of shared switches and the shared oscillator tuning circuit. In some embodiments, when the first oscillator circuit is active, the second oscillator circuit is inactive to allow the sharing of the shared oscillator tuning circuit.

18 Claims, 10 Drawing Sheets

LOW-AREA, WIDE RANGE CLOCKING SCHEME USING INDUCTANCE/CAPACITANCE OSCILLATORS

CROSS-REFERENCE TO RELATED APPLICATIONS-CLAIM OF PRIORITY

The present application claims priority to Indian Provisional Application No. 202141038433, filed Aug. 25, 2021, entitled "Low-Area, Wide Range Clocking Scheme using LC Oscillators", which is herein incorporated by reference in its entirety.

TECHNICAL FIELD

The present disclosure relates to integrated circuit design and more particularly to designs for oscillators within an integrated circuit.

BACKGROUND

Semiconductor Integrated-Circuits (ICs) are used in most of the electronic equipment being designed today. Many of these ICs have clocks that are an essential component of the design. Examples of circuits in which clocks play a key role include Serializer/Deserializer (SerDes) circuits, central processing units (CPUs), graphics processing units (GPUs), memory devices and generally in communication circuits that transmit or receiving data. Several of these applications require clocks to be generated over a relatively wide frequency range and with relatively low noise. Inductance/Capacitance (LC) oscillators are preferred for generating clocks with low noise, but LC oscillators require a large amount of area.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

A relatively large area is required for an Inductance/Capacitance (LC) oscillator. This makes it difficult to put as many oscillators on the same integrated circuit (IC) chip as are sometimes required to generate clocks over a wide range of frequencies. Several LC oscillator architectures appropriate for use in IC designs that require a relatively wide operational frequency range and that can be fabricated in a relatively small area on an IC chip are disclosed. In accordance with some embodiments, multiple LC oscillator circuits are fabricated in a small area by fabricating inductors of the different oscillator circuits in a closed area. In addition, elements of the various oscillator circuits are shared. In accordance with some embodiments, only one oscillator circuit is active at a time. Accordingly, the active oscillator circuit can use all of the shared elements without impacting the inactive oscillator circuits with which the elements are shared.

In some embodiments, the area required for the disclosed wide frequency range LC oscillator is essentially the same as the area required for a conventional oscillator having only one oscillator circuit. This is true without regard for the number of oscillator circuits provided within the disclosed wide frequency range LC oscillator. Accordingly, multiple oscillator circuits within the area of a single oscillator provide a desired wide operational frequency range without facing an area penalty. As a result, each oscillator circuit can operate over a smaller range of frequencies. This reduces the power consumption when operating any one of the oscillator circuits, allowing the disclosed wide frequency LC oscillator to operate with a relatively low power requirement.

Figure 1:
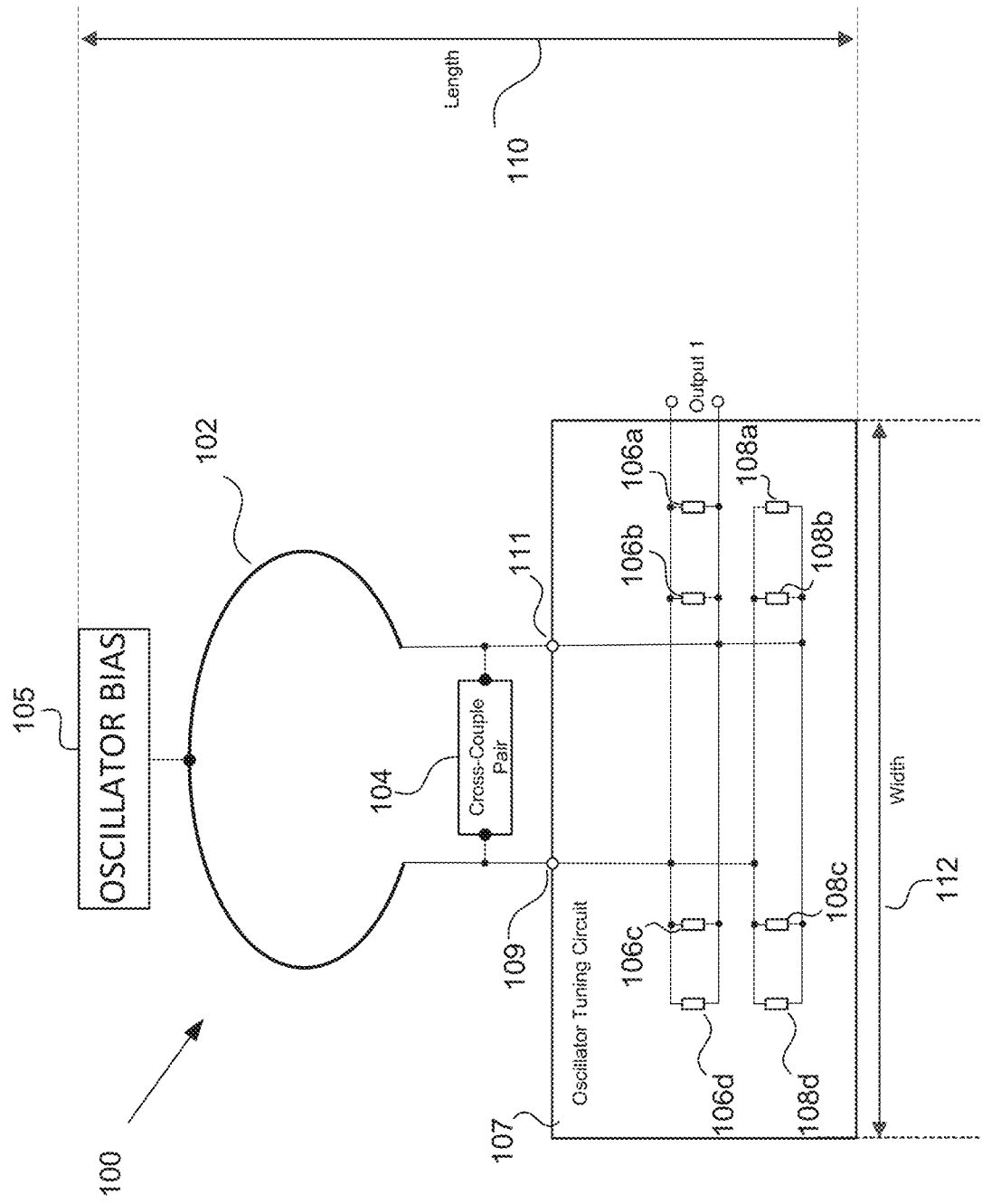
FIG. 1 is a simplified schematic diagram of an LC oscillator in accordance with some of the disclosed embodiments.
Figure 2:
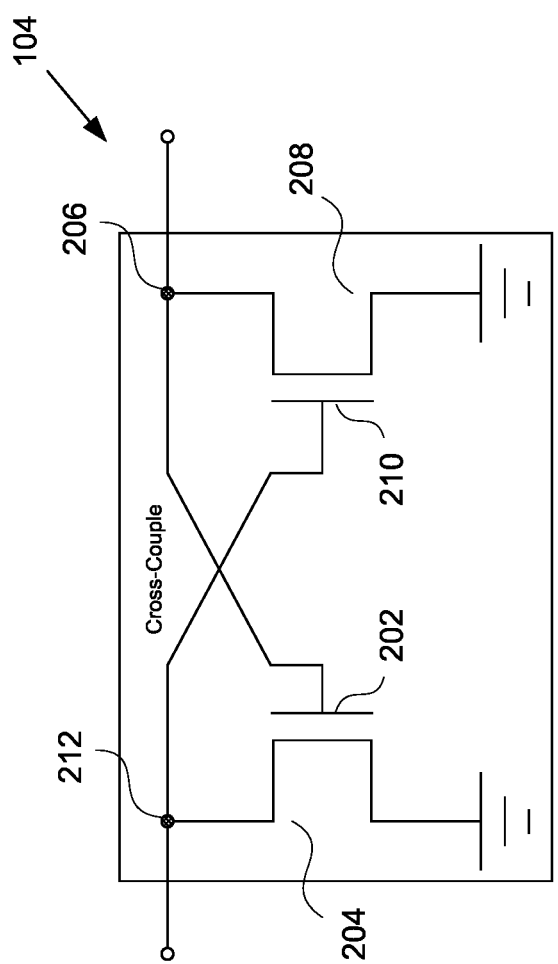
FIG. 2 is a simplified schematic of one example of a cross-coupled pair.

FIG. 1 is a simplified schematic diagram of an LC oscillator 100. The oscillator has an inductive portion 102. The inductive portion 102 is coupled to a cross-couple circuit 104 comprising a cross-coupled pair. FIG. 2 is a simplified schematic of one example of a cross-couple circuit 104. The gate 202 of a first FET 204 is coupled to the drain 206 of a second FET 208. Similarly, the gate 210 of the second FET 208 is coupled to the drain 212 of the first FET 204. The cross-couple circuit 104 has a negative impedance looking in. Accordingly, when placed in parallel with the inductive portion 102 of the LC oscillator 100, the negative impedance of the cross-couple circuit 104 is matched to the inductance of the inductive portion 102 at the highest possible resonant frequency of the LC oscillator 100. That is, with no other capacitive impedance placed in parallel with the inductive portion 102, the oscillator will oscillate at a resonant frequency of:

$1/\sqrt{LC}$: where L is the inductance of the inductive portion 102; and

C is the capacitance of the cross-couple circuit 104.

An oscillator bias 105 is provided to entice the oscillator 100 to oscillate. It can be seen that by placing an oscillator tuning circuit 107 in parallel with the inductance L, and selecting the oscillator tuning capacitance, the frequency of the oscillator 100 can be decreased. For example, in some embodiments, oscillator tuning circuit 107 comprising a set of capacitance selection circuits, such as digitally switched capacitances (DSCs) 106, can be selectively placed in parallel with the inductive portion 102 and with the cross-couple circuit 104. Four such DSCs 106a, 106b, 106c, 106d are shown, however, more or less such DSCs 106 may be present the oscillator 100. It should be noted that throughout this document, elements shown in the figures having a reference with a numeric portion followed by an alphabetic portion, such as 106a, are essentially identical to other elements having the same numeric portion, but with a different alphabetic portion. For example, the DSC 106a is essentially the same as the DSC 106b. Furthermore, a group of such identical elements may be referenced by the numeric portion alone. Thus, the group of DSC 106a, 106b, 106c, 106d may be referenced simply as 106.

Figure 3:
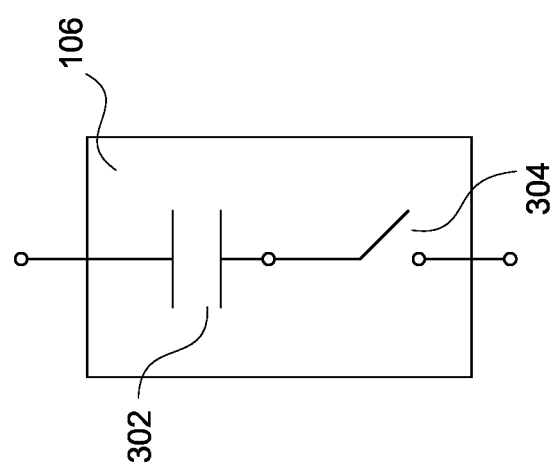
FIG. 3 is a simplified schematic of one example of a DSC.

FIG. 3 is a simplified schematic of one example of a DSC 106. A capacitor 302 and a shared switch 304 are coupled in parallel within the DSC 106. Accordingly, when the shared switch 304 is closed, the capacitor 302 is placed in parallel with the inductive portion 102. When the shared switch 304 is open, the capacitor 302 is disconnected from the inductive portion 102, reducing the amount of capacitance that is in parallel with inductive portion 102. In some embodiments, a CVC (continuously variable capacitance) 108 is selectively placed in parallel with the inductive portion 102.

Figure 4:
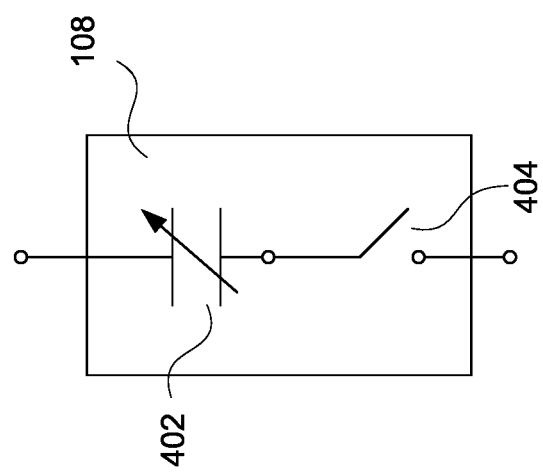
FIG. 4 is a simplified schematic of one example of a selectable continuously variable capacitance implemented with a varactor coupled in series with a shared switch.

FIG. 4 is a simplified schematic of one example of a CVC 108 implemented with a varactor 402 coupled in series with a shared switch 404. The varactor 402 is controlled by a continuously variable control voltage (not shown for the sake of simplicity). Similar to the DSC 106, closing the shared switch 404 places the varactor 402 in parallel with the inductive portion 102. Opening the shared switch 404 disconnects the varactor 402 from the inductive portion 102.

By altering the reactance (e.g., capacitance) of the oscillator 600 by adjusting the capacitance of an oscillator tuning circuit 107 (i.e., adjusting capacitance selection circuits, such as DSC 106 and CVC 108, the frequency of the oscillator can be selectively tuned. It should be understood that other components may also be selectively coupled to inductive portion 102 to alter the frequency of the oscillator 100.

The physical length of the oscillator 100 (as indicated by the double-headed arrow 110) can be measured from the distal most point of oscillator bias 105 to the proximal most point of the oscillator tuning circuit 107. The physical width of the oscillator 100 can be measured as the distance from one end of the oscillator 100 along an axis perpendicular to the length to the other end of the oscillator 100, as indicated by the double-headed arrow 112. In some embodiments, the inductive portion 102 defines the width. In other embodiments, the edges of the oscillator tuning circuit 107 define the width of the oscillator 100, depending upon which extends further in a direction perpendicular to the length.

In some cases, the frequency range that can be attained with such an LC circuit is limited to a smaller range than is required for a particular IC design. In some such cases, the oscillator is provided that has two oscillator circuits. The first oscillator is designed to oscillate in a relatively lower range and the second oscillator is designed to oscillate in a relatively higher range. Accordingly, the particular oscillator that is capable of operating in the frequency range desired is coupled to a clock output port and the other oscillator is disconnected or may be used as a second clock source.

Figure 5:
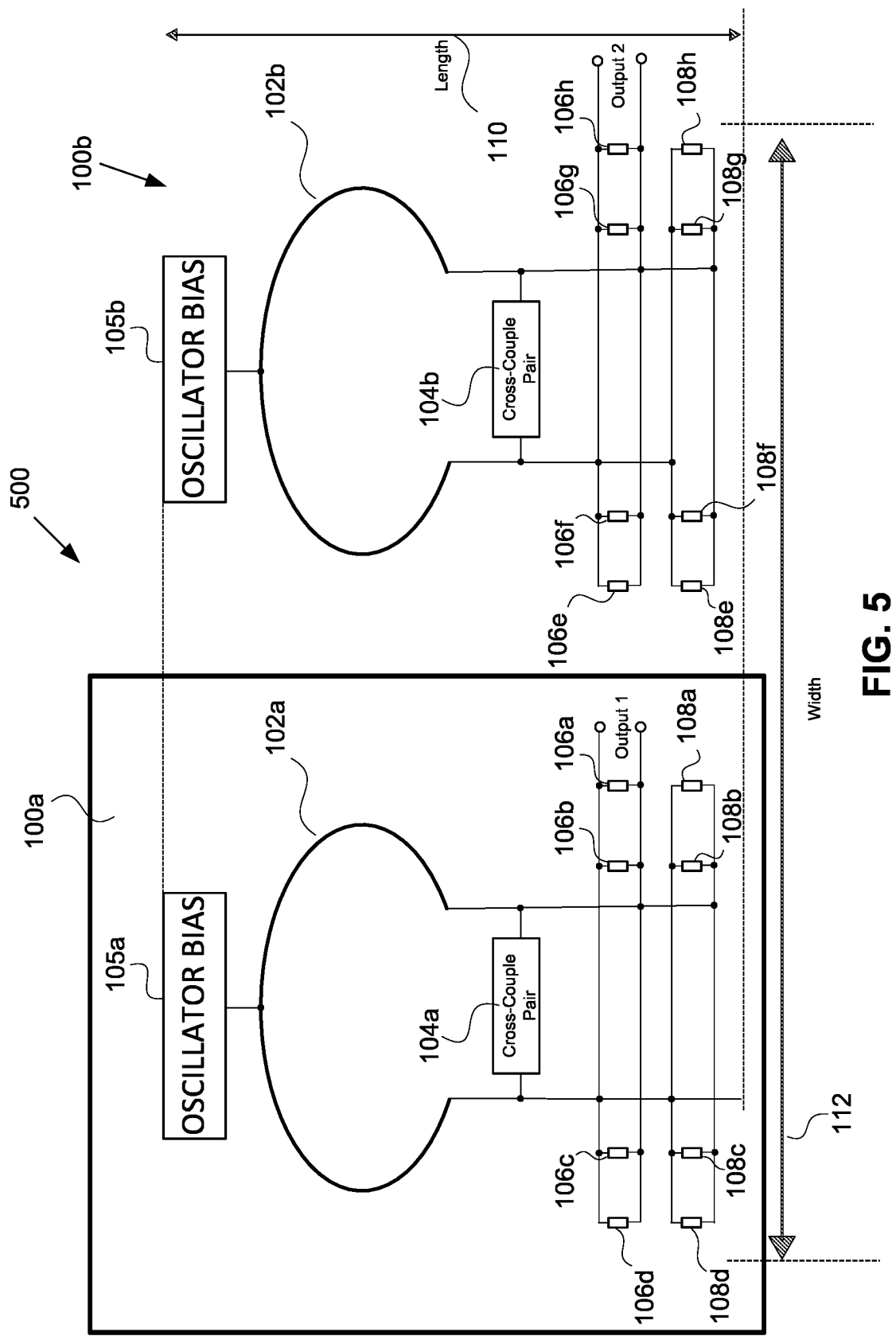
FIG. 5 is a simplified illustration of an oscillator having two oscillator circuits, each similar to the oscillator of FIG. 1.

FIG. 5 is a simplified illustration of an oscillator 500 having two oscillator circuits 100a, 100b, each similar to the oscillator 100 of FIG. 1. The height of the oscillator 500 remains approximately the same as the oscillator 100. However, the width of the oscillator 500 is at least twice that of the oscillator 100. While this approach accomplishes the goal of extending the range of the oscillator 500 beyond what is possible with either the first or second oscillator circuit alone, the amount of real estate required is difficult to provide in some designs.

Figure 6:
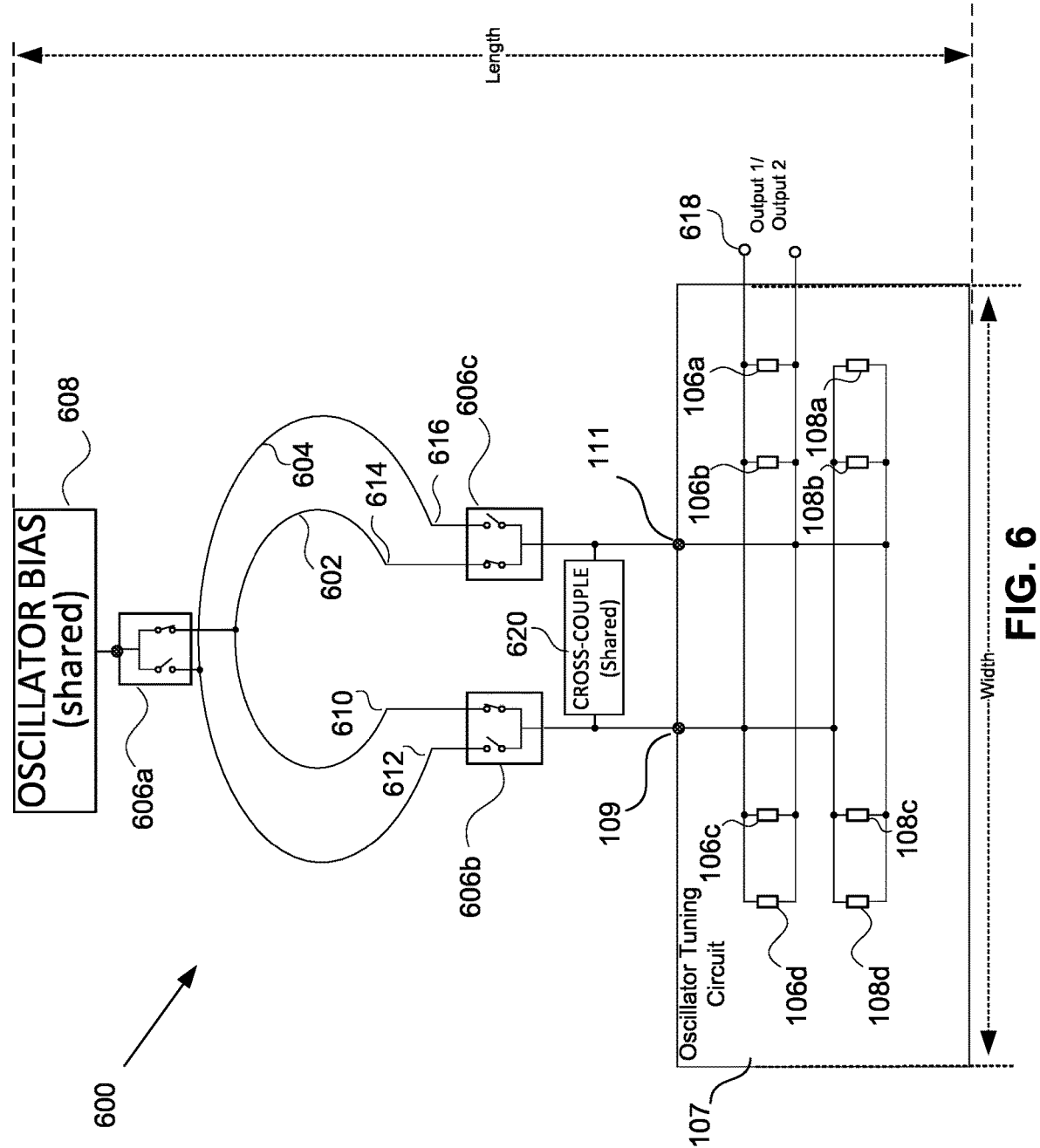
FIG. 6 is an illustration of an oscillator having two oscillator circuits.

FIG. 6 is an illustration of an oscillator 600 having two oscillator circuits (dual oscillator circuit). The first oscillator circuit comprises a first inductive portion 602 and the second oscillator circuit comprises a second inductive portion 604. Each of the inductive portions 602, 604 has a different value of inductance. Thus, each oscillator circuit can be tuned to frequencies that lie within different frequency ranges. In some embodiments, such as the embodiment shown in FIG. 6, the inductive portions 602, 604 are interleaved. In addition, the oscillator 600 has three shared switches 606 that are shared between a first and second oscillator circuit. In some embodiments, the shared switches 606 are each single pole, double throw switches in which one throw is open when the other is closed. The shared switches 606 select which oscillator circuit will be active and which oscillator circuit will be inactive by connecting one of the two inductive portions 602, 604 to a shared oscillator bias 608 and a shared oscillator tuning circuit 107. The first shared switch 606a connects the active inductive portion 602 to a shared oscillator bias 608. The second shared switch 606b connects a proximal end 610 of the active inductive portion 602 to a first oscillator port 109 of the shared oscillator tuning circuit 107. The third shared switch 606c selects the distal end 614, 616 of the active inductive portion 602 to be connected to a second oscillator port 111 of the shared oscillator tuning circuit 107. The three shared switches 606 are switched together to: (1) select one of the two inductive portions 602, 604 as the active inductive portion 602, (2) apply an oscillator bias 608 to the active inductive portion 602, (3) place a cross-couple circuit 620 between the proximal end 610 and the distal end 614 of the active inductive portion 602, and (4) further place the shared oscillator tuning circuit 107 in parallel with the cross couple circuit 620. Accordingly, when the first oscillator circuit is active, it comprises the shared oscillator bias 608, the shared switches 606, the inductive portion 602, the cross-couple circuit 620 and the shared oscillator tuning circuit 107.

As shown in FIG. 6, the first inductive portion 602 is completely contained within the footprint of the second inductive portion 604. Accordingly, a relatively small amount of additional real estate is required to fabricate the dual oscillator circuit 600. Furthermore, it will be understood that additional such inductive portions (not shown) could be nested within the footprint of the first inductive portion 602. In such case, additional throws would be present in the shared switches 606 to allow the additional inductive portions to be properly connected to activate those portions when the oscillator is running with those portions providing the desired inductive reactance to affect the frequency of the output of the oscillator 600.

Figure 7:
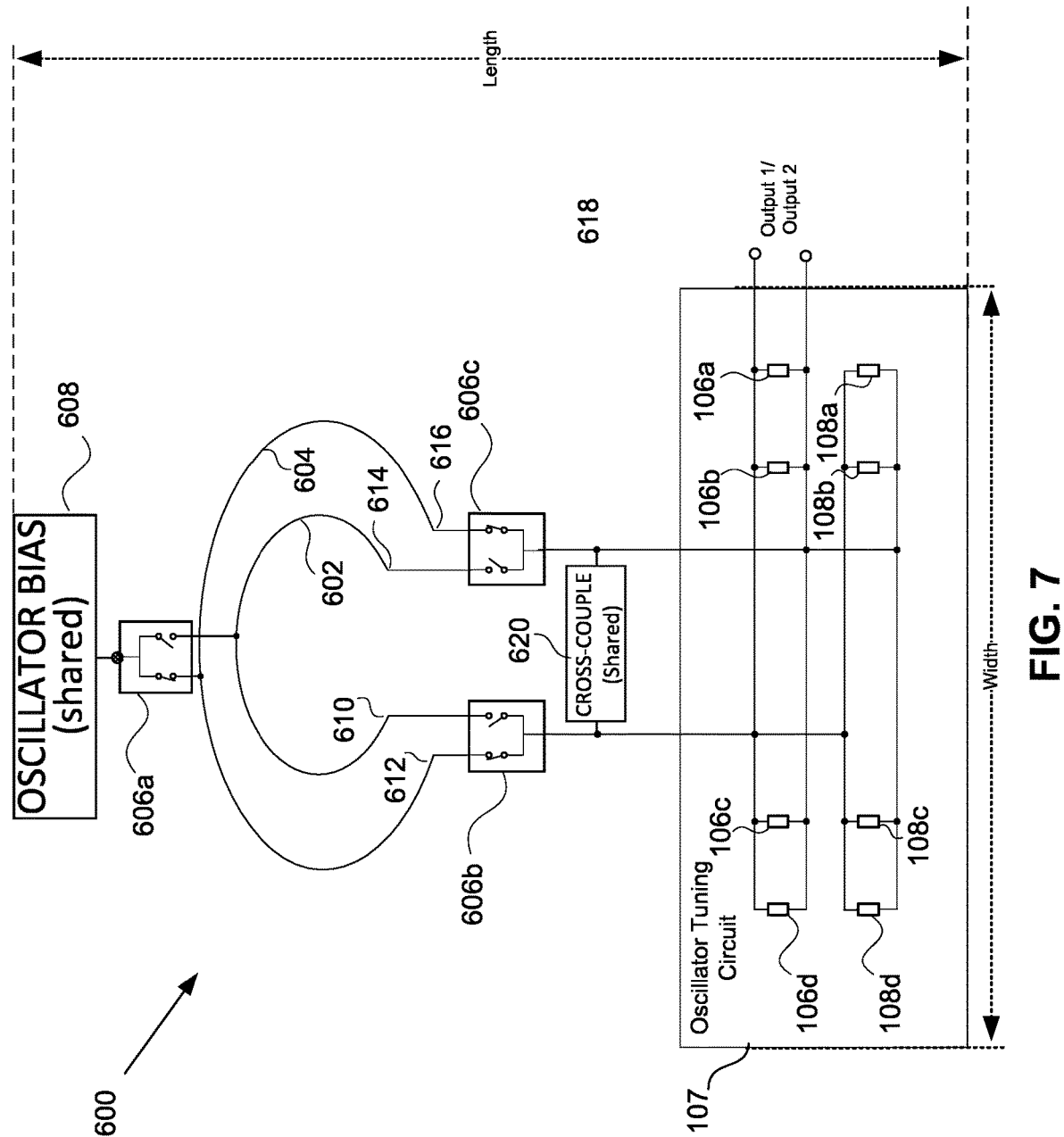
FIG. 7 is an illustration of the oscillator when the shared switches change to cause the inductive portion to become inactive and the inductive portion to become active.

FIG. 7 is an illustration of the oscillator 600 when the shared switches 606 change to cause the inductive portion 602 to become inactive and the inductive portion 604 to become active. That is, shared switch 606a changes to disconnect the oscillator shared bias 608 from the formerly active inductive portion 602 and connect the oscillator bias 608 to the newly active inductive portion 604. Similarly, the shared switches 606b, 606c change to disconnect the shared cross-couple circuit 620 and the shared oscillator tuning circuit 107 from the formerly active inductive portion 602 and place them in parallel with the newly active inductive portion 604. Accordingly, when the second oscillator circuit is active it comprises the shared oscillator bias 608, the shared switches 606, the inductive portion 604, the cross-couple circuit 620 and the shared oscillator tuning circuit 107.

In some embodiments, all of the contacts of the shared switches 606 may be opened to de-activate both of the inductive portions 602, 604.

Figure 8:
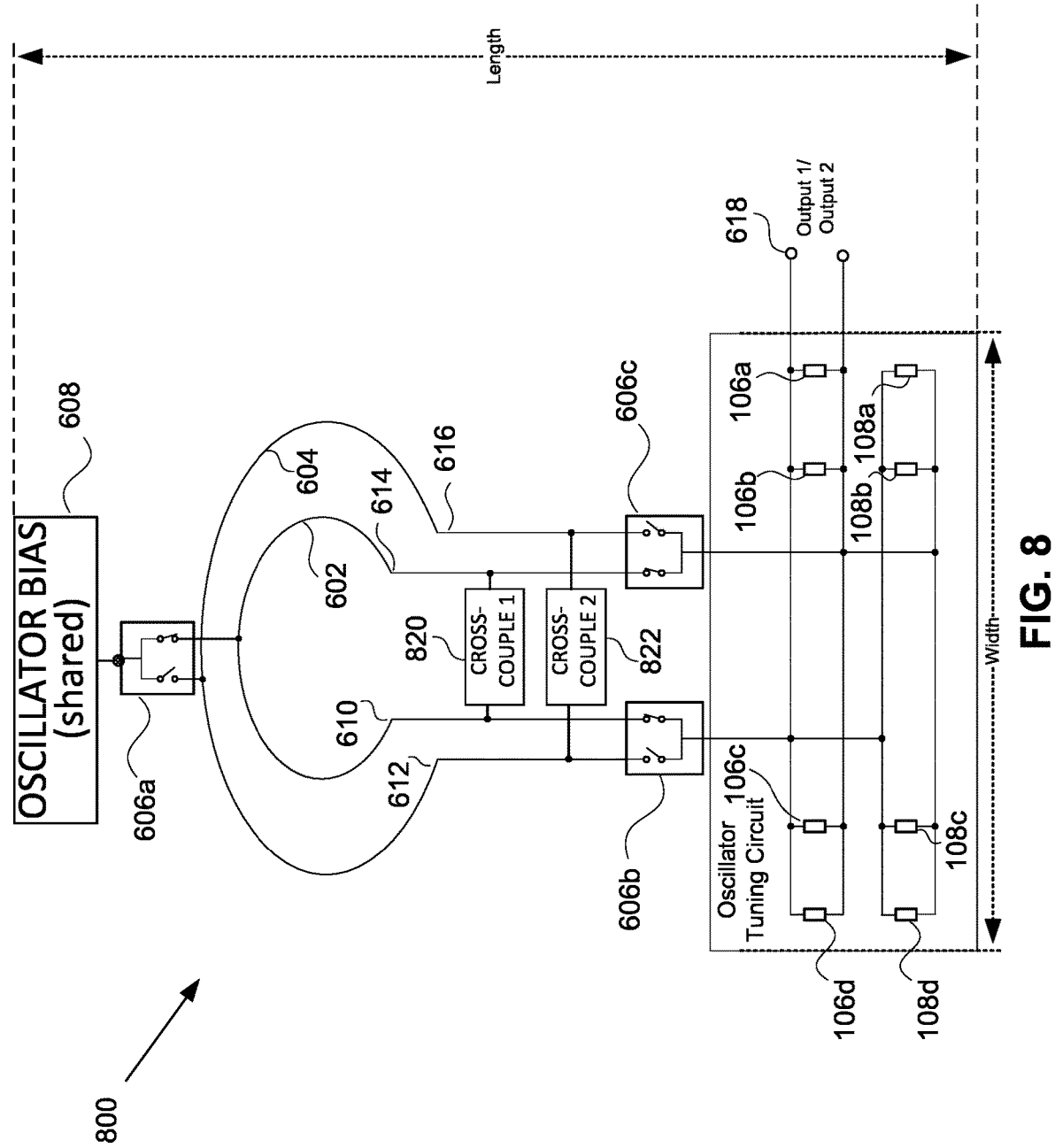
FIG. 8 is an illustration of an oscillator having a shared oscillator tuning circuit and shared oscillator bias, but with independent cross-coupled pairs to be used with each of the oscillator circuit.

FIG. 8 is an illustration of an oscillator 700 having a shared oscillator tuning circuit 107 and shared oscillator bias 608, but with independent cross-couple circuits 720, 722 to be used with each of the oscillator circuit. Accordingly, when the first oscillator circuit is active, it comprises the shared oscillator bias 608, the shared switches 606, the inductive portion 602, a first cross-couple circuit 720 and the shared oscillator tuning circuit 107. When the second oscillator circuit is active it comprises the shared oscillator bias 608, the shared switches 606, the inductive portion 604, the cross-couple circuit 620 and the shared oscillator tuning circuit 107.

Figure 9:
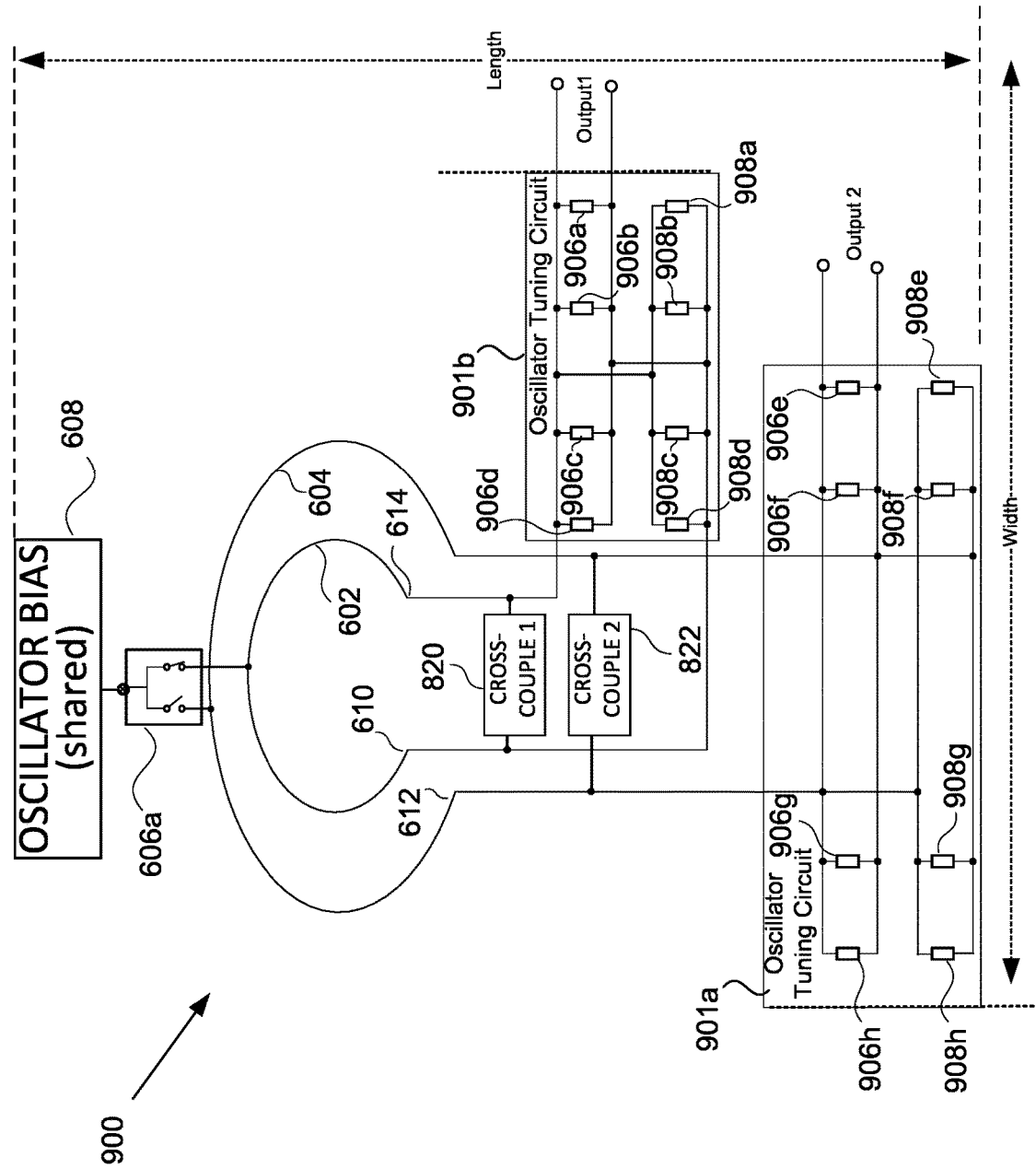
FIG. 9 is an illustration of an oscillator similar to the oscillator of FIG. 8, however with independent oscillator tuning circuits.

FIG. 9 is an illustration of an oscillator 900 similar to the oscillator 800. However, a separate oscillator tuning circuit 901 having various DSCs 906 and CVCs 908 is provided for each oscillator circuit.

Figure 10:
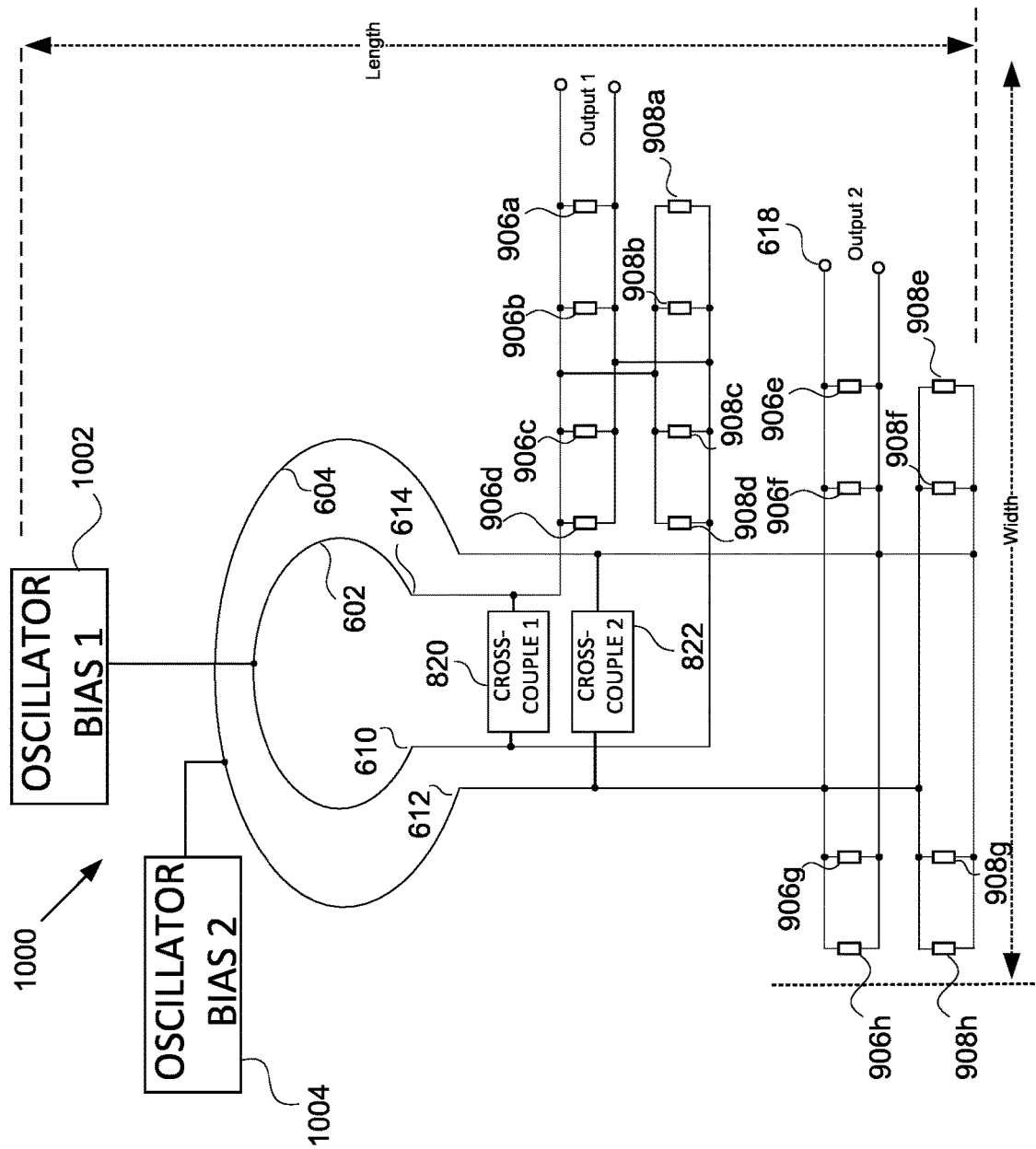
FIG. 10 is an illustration of an oscillator similar to the oscillator, however a separate oscillator bias circuit is provided for each of the two oscillator circuits.

FIG. 10 is an illustration of an oscillator 1000 similar to the oscillator 900, however, a separate oscillator bias circuit 1002, 1004 is provided for each of the two oscillator circuits.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. An oscillator comprising:
   a first oscillator circuit having a first inductive portion, a plurality of shared switches for selectively connecting the first inductive portion to a first oscillator tuning circuit having a first oscillator port and second oscillator port; and
   a second oscillator circuit having a second inductive portion, the plurality of shared switches and the first oscillator tuning circuit;
   wherein when the first oscillator circuit is active, the second oscillator circuit is inactive to allow the sharing of the first oscillator tuning circuit.

2. The oscillator of claim 1, wherein the first inductive portion of the first oscillator circuit is completely within the footprint of the second inductive portion of the second oscillator circuit.

3. The oscillator of claim 2, further comprising a shared cross-couple circuit having a first cross-couple port coupled to the first oscillator port and a second cross couple port coupled to the second oscillator port.

4. The oscillator of claim 2, further comprising:
   a. a first cross-couple circuit having a first cross-couple port coupled to the proximal end of the first inductive portion and a second cross couple port coupled to the distal end of the first inductive portion; and
   b. a second cross-couple circuit having a first cross-couple port coupled to the proximal end of the second inductive portion and a second cross couple port coupled to the distal end of the second inductive portion.

5. The oscillator of claim 2, further comprising a first oscillator tuning circuit.

6. The oscillator of claim 2, further comprising an oscillator bias circuit coupled to a first of the plurality of shared switches, the first of the plurality of shared switches configured to couple the oscillator bias circuit to the first inductive portion when in a first switch position and to couple the oscillator bias circuit to the second inductive portion when in a second switch position.

7. The oscillator of claim 2, further comprising at least a third oscillator circuit, the at least a third oscillator circuit having an additional inductive circuit, the plurality of shared switches and the shared oscillator tuning circuit, the additional inductive circuit residing completely within the footprint of the first inductive circuit.

8. The oscillator of claim 2, wherein:
   a. the first inductive portion and the second inductive portion each have a distal end and a proximal end;
   b. the shared oscillator tuning circuit has a first oscillator port and a second oscillator port;
   c. each of the plurality of shared switches have a first and second switch position; and
   d. when each of the plurality of shared switches is in the first switch position:
      i. the oscillator bias circuit is coupled to the first inductive portion through a first of the plurality of shared switches;
      ii. the proximal end of the first inductive portion of the first oscillator circuit is coupled to the first oscillator port of the oscillator tuning circuit through a second of the plurality of shared switches; and
      iii. the distal end of the first inductive portion of the first oscillator circuit is coupled to the second oscillator port of the oscillator tuning circuit through a third of the plurality of shared switches.

9. The oscillator of claim 2, wherein:
   a. the first inductive portion and the second inductive portion each have a distal end and a proximal end;
   b. the shared oscillator tuning circuit has a first oscillator port and a second oscillator port;
   c. each of the plurality of shared switches have a first and second switch position; and
   d. when each of the plurality of shared switches is in the second switch position:
      i. the oscillator bias circuit is coupled to the second inductive portion through a first of the plurality of shared switches,
      ii. the proximal end of the second inductive portion of the second oscillator circuit is coupled to the first oscillator port of the oscillator tuning circuit through a second of the plurality of shared switches; and
      iii. the distal end of the second inductive portion of the second oscillator circuit is coupled to the second oscillator port of the oscillator tuning circuit through a third of the plurality of shared switches.

10. A non-transitory computer readable medium comprising instructions which when executed by a processing device, cause the processing device to generate a digital representation of an oscillator, the oscillator comprising:
   a. a first oscillator circuit having a first inductive portion, a plurality of shared switches for selectively connecting the first inductive portion to a first oscillator tuning circuit having a first oscillator port and second oscillator port; and
   b. a second oscillator circuit having a second inductive portion, the plurality of shared switches and the first oscillator tuning circuit;
   wherein when the first oscillator circuit is active, the second oscillator circuit is inactive to allow the sharing of the first oscillator tuning circuit.

11. The non-transitory computer readable medium of claim 10, further comprising instructions which when executed by the processing device, cause the processing device to generate the digital representation of the oscillator, wherein the first inductive portion of the first oscillator circuit is completely within the footprint of the second inductive portion of the second oscillator circuit.

12. The non-transitory computer readable medium of claim 11, wherein the digital representation of the oscillator generated further comprises a shared cross-couple circuit having a first cross-couple port coupled to the first oscillator port and a second cross couple port coupled to the second oscillator port.

13. The non-transitory computer readable medium of claim 11, wherein the digital representation of the oscillator generated further comprises:
   a. a first cross-couple circuit having a first cross-couple port coupled to the proximal end of the first inductive portion and a second cross couple port coupled to the distal end of the first inductive portion; and
   b. a second cross-couple circuit having a first cross-couple port coupled to the proximal end of the second inductive portion and a second cross couple port coupled to the distal end of the second inductive portion.

14. The non-transitory computer readable medium of claim 11, wherein the digital representation of the oscillator generated further comprises a first oscillator tuning circuit.

15. The non-transitory computer readable medium of claim 11, wherein the digital representation of the oscillator generated further comprises an oscillator bias circuit coupled to a first of the plurality of shared switches, the first of the plurality of shared switches configured to couple the oscillator bias circuit to the first inductive portion when in a first switch position and to couple the oscillator bias circuit to the second inductive portion when in a second switch position.

16. The non-transitory computer readable medium of claim 11, wherein the digital representation of the oscillator generated further comprises at least a third oscillator circuit, the at least a third oscillator circuit having an additional inductive circuit, the plurality of shared switches and the shared oscillator tuning circuit, the additional inductive circuit residing completely within the footprint of the first inductive circuit.

17. The non-transitory computer readable medium of claim 11, further comprising instructions which when executed by the processing device, cause the processing device to generate the digital representation of the oscillator, wherein:
   a. the first inductive portion and the second inductive portion each have a distal end and a proximal end;
   b. the shared oscillator tuning circuit has a first oscillator port and a second oscillator port;
   c. each of the plurality of shared switches have a first and second switch position; and
   d. when each of the plurality of shared switches is in the first switch position:
      i. the oscillator bias circuit is coupled to the first inductive portion through a first of the plurality of shared switches;
      ii. the proximal end of the first inductive portion of the first oscillator circuit is coupled to the first oscillator port of the oscillator tuning circuit through a second of the plurality of shared switches; and
      iii. the distal end of the first inductive portion of the first oscillator circuit is coupled to the second oscillator port of the oscillator tuning circuit through a third of the plurality of shared switches.

18. The non-transitory computer readable medium of claim 11, further comprising instructions which when executed by the processing device, cause the processing device to generate the digital representation of the oscillator, wherein:
  a. the first inductive portion and the second inductive portion each have a distal end and a proximal end;
  b. the shared oscillator tuning circuit has a first oscillator port and a second oscillator port;
  c. each of the plurality of shared switches have a first and second switch position; and
  d. when each of the plurality of shared switches is in the second switch position:
    i. the oscillator bias circuit is coupled to the second inductive portion through a first of the plurality of shared switches,
    ii. the proximal end of the second inductive portion of the second oscillator circuit is coupled to the first oscillator port of the oscillator tuning circuit through a second of the plurality of shared switches; and
    iii. the distal end of the second inductive portion of the second oscillator circuit is coupled to the second oscillator port of the oscillator tuning circuit through a third of the plurality of shared switches.

* * * * *